United States Patent [19]

Orfield

[11] 4,319,088

[45] Mar. 9, 1982

[54] METHOD AND APPARATUS FOR MASKING SOUND

[75] Inventor: Steven J. Orfield, Minneapolis, Minn.

[73] Assignee: Commercial Interiors, Inc., Minneapolis, Minn.

[21] Appl. No.: 90,476

[22] Filed: Nov. 1, 1979

[51] Int. Cl.$^{3}$ .......................... H04K 3/00; H03R 3/00

[52] U.S. Cl. ................................................ 179/1.5 M

[58] Field of Search ........................ 179/1.5 M, 1 AA; 181/150, 151

[56] References Cited

U.S. PATENT DOCUMENTS

| | | | |
|---|---|---|---|
| 3,213,199 | 10/1965 | Snow . | |
| 3,567,863 | 3/1971 | Morrissey | 179/1 AA |
| 3,980,827 | 9/1976 | Sepmeyer et al. | 179/1.5 M |
| 3,985,200 | 10/1976 | Sepmeyer | 179/1.5 M |
| 3,985,957 | 10/1976 | Torn | 179/1.5 M |
| 4,024,535 | 5/1977 | Goldstein | 179/1 AA |
| 4,052,564 | 10/1977 | Propst et al. | 179/1.5 M |
| 4,054,751 | 10/1977 | Calder et al. | 179/1.5 M |
| 4,059,726 | 11/1977 | Watters et al. | 179/1.5 M |
| 4,098,370 | 7/1978 | McGregor | 179/1.5 M |
| 4,185,167 | 1/1980 | Cunningham | 179/1.5 M |

FOREIGN PATENT DOCUMENTS 1420201 1/1976 United Kingdom ............ 179/1 AA

OTHER PUBLICATIONS

"Speech Privacy in Building, " Cavanaugh et al, *Journal of the Acoustical Society of America,* vol. 34, No. 4, Apr. 1962, pp. 475-492.

*Primary Examiner*—Howard A. Birmiel
*Attorney, Agent, or Firm*—Merchant, Gould, Smith, Edell, Welter & Schmidt

[57] ABSTRACT

A method and apparatus for masking sound is disclosed. A master sound masking unit (14) having a sound masking generator (20), an amplifier (22), a ten-octave equalizer (24) and a dual voice coil speaker (26) therewithin. Slave sound masking units (16) are connected to master unit (14) by detachable cables (18). Master unit (14) may also be used alone without slave units (16). If used with slave unit (16), master and slave units are arranged into zones and connected and adjusted in accordance with the method for producing optimum sound masking results described herewithin.

8 Claims, 8 Drawing Figures

METHOD AND APPARATUS FOR MASKING SOUND

TECHNICAL FIELD

The present invention relates to sound masking devices and methods for masking speech intelligibility within the interior space of a building.

BACKGROUND OF THE INVENTION

With the advent of open plan space interiors (i.e. large interior spaces without floor to ceiling walls) in office buildings, the problem of providing a suitable working environment and sufficient degree of confidentiality within each space has arisen. At least a partial solution to the problem of noise propagation throughout the open space has been in the form of sound masking. The basic concept of sound masking involves the introduction of a speech frequency masking sound, sometimes incorrectly referred to as pink or white noise, into the interior space to increase the background level of sound at certain frequencies. By increasing the background level, ambient noise becomes less noticeable and previously intelligible signals away from their source become less intelligible, thus preventing annoying interference in adjoining spaces. Prior attempts at sound masking have attempted to produce a uniform masking sound throughout the entire uniform space in the belief that it would be less noticeable. This theory, however, was unable to cope with different needs within zones of the interior space. In the past sound masking has been attempted by installing speakers near the sources of noise (such as in U.S. Pat. No. 4,052,564 issued to Propst et al.) or within the enclosed ceiling plenum above such noise sources. The speakers emitting masking sound may be completely self-contained and independently driven or be part of a central system having a single amplifier and a tunable noise generator source and a plurality of output speakers located distant from the central sound source. Such a central masking system is analogous with a central paging system commonly found in office buildings. In the case of a central system, the system is tuned to a predetermined frequency spectrum and sound pressure level generally based on a variation of known preferred noise criteria curves and sound pressure levels recommended in acoustical literature. This type of system is generally a permanent installation and is evaluated in relation to its ability to conform to constant level spectrum criteria. The intent of this type of masking system is to produce a constant sound throughout a large area. These systems have met with some success, but they have severe drawbacks due to their lack of flexibility, as they use predetermined sound levels and spectrum shape to deal with changing and irregular conditions. Irregular conditions result, because of many acoustical variables such as obstruction in the ceiling plenum and varying absorptive characteristics, acoustical panels, and changes in office space layout. Certain frequencies generated by the sound masking device may be absorbed or reflected by these obstructions thereby creating an unevenness of masking sound in the interior space. In order to correct for these variations throughout the space, it would be necessary to install individual masking units having full frequency and amplitude control at nearly every output speaker. In the case of a large interior area, this could become prohibitively expensive and overly complex and is therefore unacceptable. In addition a central masking system is difficult to tune to specification since the frequency and amplitude controls are located at a central location, away from the area which is receiving the masking. Furthermore, due to variations in the electric characteristic in output speakers adjustment at each individual output is necessary to obtain uniformity throughout the space. Fortunately, the present invention overcomes the deficiencies of a central masking system, which suffers from unevenness of output, and the prohibitive cost of using individual masking units with full frequency and amplitude control. By determining zones within the larger interior area which require similar frequency masking characteristics and by providing amplitude control at each output speaker, the difficulties of the prior art can be overcome. Furthermore, by providing frequency and amplitude control right at the output of the masking device, adjustments are easily accomplished to deal with changing acoustical requirements.

SUMMARY OF THE INVENTION

The present invention discloses a method and an apparatus for masking sound in particular zones of an open plan interior office space. The apparatus includes a masking noise generator located within a master unit. Also included within the unit is further apparatus for conditioning the masking noise so as to produce an output signal which is adjustable in amplitude at particular frequencies within the masking noise band-width. The apparatus further includes slave masking units which contain amplitude control and which are connected to the master unit for receiving the conditioned masking noise output. The slave and master units are connected by means of easily disconnectable cables so as to permit rapid installation of the system and to make it possible to easily move the system to a new building if necessary.

The method disclosed includes the steps of monitoring the environmental noise within the interior space, measuring the frequency characteristics and amplitudes of the noise, establishing zones by area of similar noise characteristics, mounting a master sound masking unit essentially within each of the zones and mounting slave units peripherally around the masters, adjusting the output frequency characteristics of the master to coincide with the environmental characteristics, adjusting the output amplitude characteristics of each of the masters and slaves to produce a uniform output in each of the zones, and finally adjusting the output amplitude characteristics of the master and slaves to compensate for unevenness in environmental noise within each of the zones.

Various advantages and features of novelty which characterize the invention are pointed out with particularity in the claims annexed hereto and forming a part hereof. However, for a better understanding of the invention, its advantages, and objects attained by its use, reference should be had to the drawings which form a further part hereof, and to the accompanying descriptive matter, in which there are illustrated and described preferred embodiments of the invention.

DETAILED DESCRIPTION OF THE INVENTION

Figure 5:
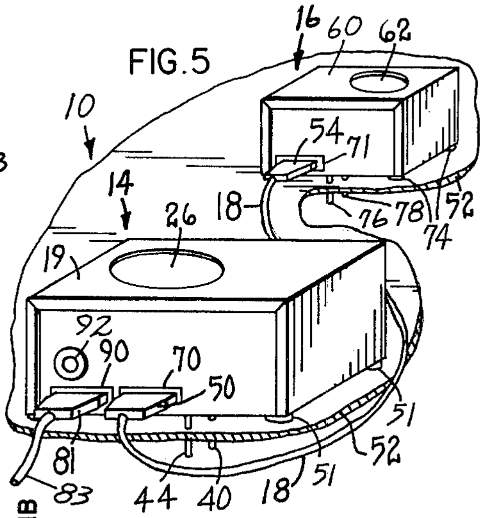
FIG. 5 is a close-up perspective view of the subject matter in FIG. 3.

Referring to the drawings, wherein like numerals represent like parts through the several views, the sound masking apparatus of the present invention, designated generally as 10 in FIG. 5, installed in a building 12. Apparatus 10 includes a master sound masking unit 14, slave sound masking unit 16 and interconnecting cable 18 shown in FIGS. 5 and 6 respectively.

Figure 1:
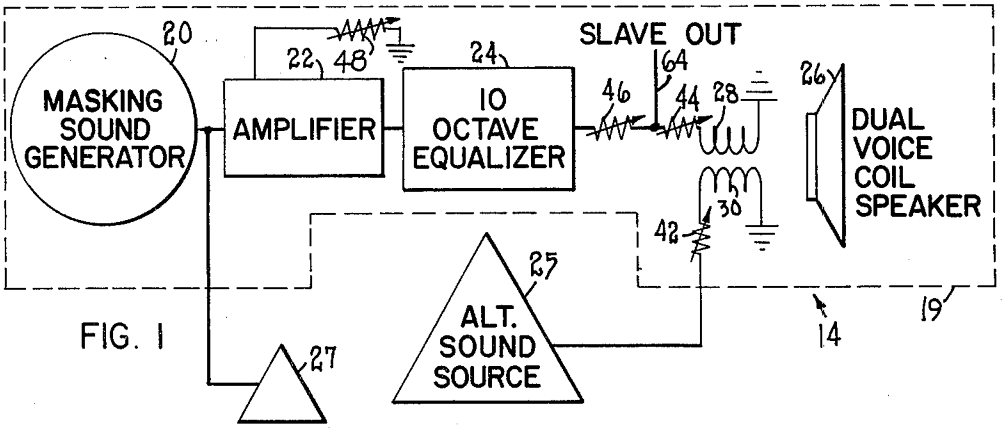
FIG. 1 is a block diagram illustration of a master sound masking unit of the present invention.
Figure 6:
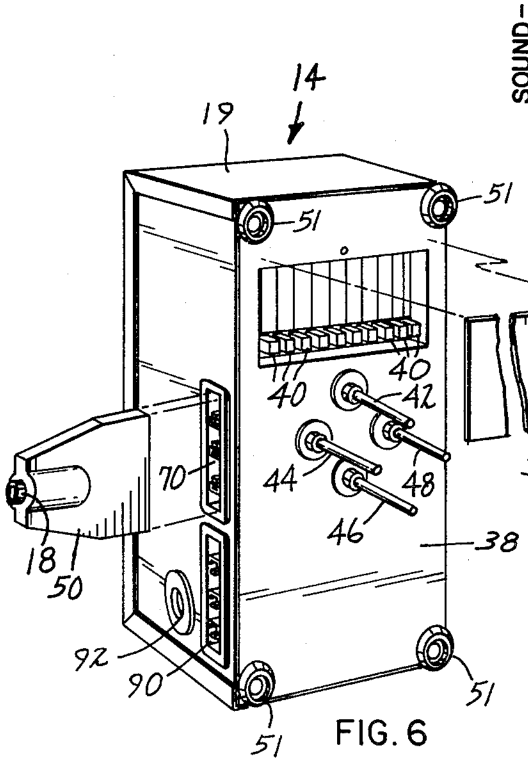
FIG. 6 is a close-up perspective view of the master unit shown in FIG. 5.

Turning first to the master unit 14, FIG. 1 shows in block diagram form the elements of master unit 14. Included within its enclosure 19 is a sound masking generator 20, an amplifier 22, a 10 octave equalizer 24, a dual voice coil speaker 26 which includes voice coil 28 which is connected to the output of equalizer 24 and voice coil 30 which can be connected to one or more alternative sound source 25, such as music source or paging source. Dual voice coil speakers are available from numerous speaker manufacturers. When selecting such a speaker 26, it is desirable to employ matched speakers, that is, speakers whose output characteristics are within one half db of each other, for best results. It is also possible to carry a second alternative sound source 27 in tandem with the output of the masking sound generator 20. This combined input would be amplified by amplifier 22, conditioned by equalizer 24 and outputted as described above for the single sound masking output. This second alternative sound source 27 may also be used in paging or the like. Numerous means are known for generating such random noise signals, such as circuitry disclosed in the U.S. Pat. No. 4,024,535 issued to Goldstein. The 10 octave equalizer, also known as a decade equalizer, is well-known in the industry and is commercially available as discrete units. Control of the amplitude of each octave is accomplished by means of adjustments to trimmers or potentiometers 40 in unit 14 which are reachable by removing face plate 32 which is held in place by screw 34 on face 38 of unit 14 as shown in FIG. 6. The plurality of trimmers or potentiometers 40 control the output of each octave of the equalizer.

Master unit 14 also includes potentiometers 42, 44, 46 and 48 which are mounted on face 38 of enclosure 19. Unit 14 is preferably mounted on rubber feet 51 on top of ceiling tile 52 as shown in FIG. 5, with holes drilled in tile 52 to permit potentiometers 42–48 to extend therethrough for easy adjustment without the need to open the ceiling to make certain adjustments. Potentiometer 42 controls the audio output of alternative sound source signals which are fed into voice coil 30 of speaker 26. Potentiometer 44 controls the signal strength fed into voice coil 28 of speaker 26. Potentiometer 46 controls the overall output of equalizer 24. Potentiometer 48 is a frequency trimming control also known as a tone control, which adjusts the frequency output of amplifier 22.

Slave unit 16 contains within its enclosure 60 a dual voice coil speaker 62 of the type 26 shown in FIG. 1 which includes voice coils 66 and 68. The slave output 64 from the octave equalizer 24 is connected to speaker 62 via voice coil 66. Alternative sound sources may also be inputted to speaker 62 via the second voice coil 68. The input to coil 66 is made at jack 70 which is mounted on enclosure 60. Slave unit 16 similarly has bottom face 72 which has rubber feet 74 attached thereto for locating on ceiling tile 52 in the same manner as unit 14 is located. Extending from face 72 are potentiometers 76 and 78. Potentiometer 76 controls the input to coil 66, thereby adjusting the level of masking noise output at the slave unit. Potentiometer 78 controls the level of signal inputted into voice coil 68 thereby controlling the level of alternative sound source signal which is outputted through speaker 62. As in master unit 14 the potentiometer shafts of potentiometers 76, 78 extend through the ceiling tile for ease for adjustment.

Figure 2:
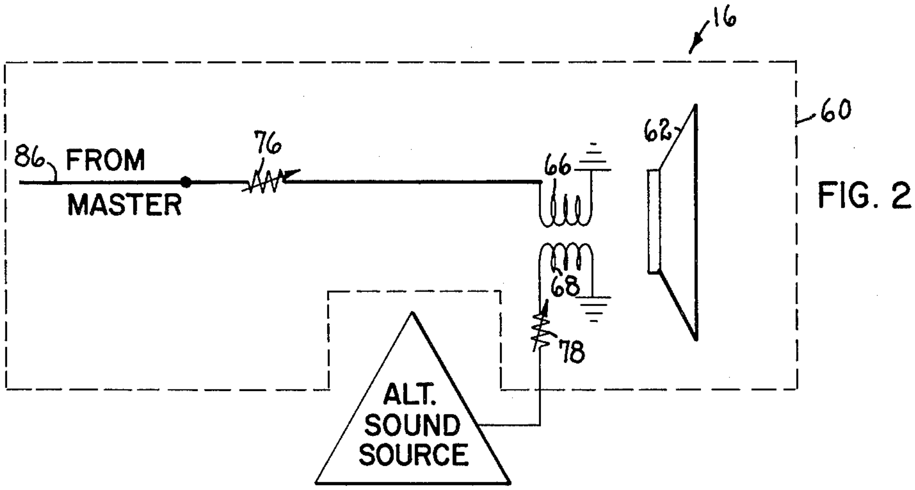
FIG. 2 is a block diagram illustration of a slave sound masking unit of the present invention.
Figure 4:
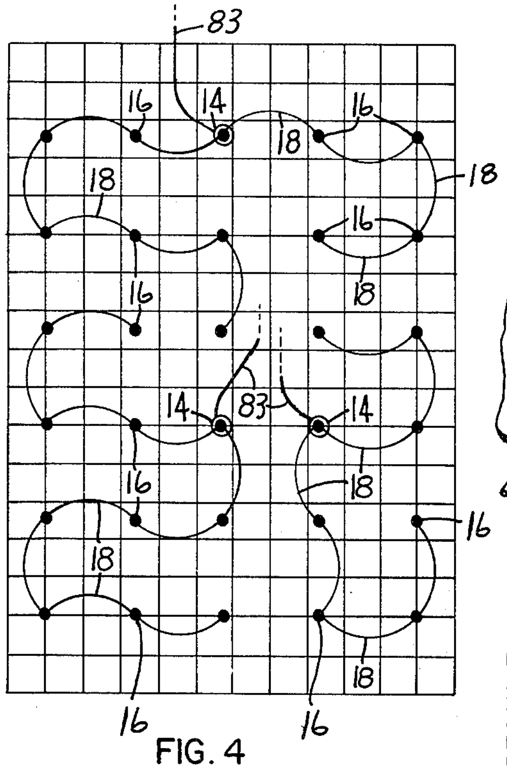
FIG. 4 is a top diagrammatical view taken along line 4—4 of a portion of FIG. 3.
Figure 7:
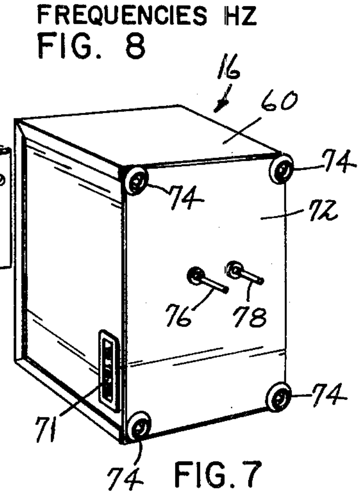
FIG. 7 is a close-up perspective view of the slave unit shown in FIG. 5.

In order to connect master unit 14 to slave unit 16, an interconnect cable 18 is employed. This cable has at one end connector 50 and at the other end connector 54. Numerous suitable connectors and jacks are commonly available, connectors, the only requirement being that they are easily disconnectible and meet building code requirements where necessary. A flexible cable 18 includes conductors necessary to carry the signal from the master unit tapped at point 64 on FIG. 1 to the slave unit 16 at point 86 on FIG. 2. Conductors may also be provided within cable 18 for carrying an alternative sound source signal which may be inputted to voice coil 68 of the slave unit 16. Each master unit contains two jacks 70 connected in parallel (one of which is shown in FIGS. 5, 6 and 7) designed to receive connectors 50. This arrangement permits two identical slave units 16 to be connected to master 14 to receive masking and audio signals from the master unit. Additional slave units 16 can thereafter be connected to this first pair of slave units to create a chain as shown in FIG. 4.

Slave unit 16 also includes a jack 71 and a jack 70 (not shown) connected in parallel for receiving connector 54 of cable 18 for supplying the necessary audio signals to the slave units. Master unit 16 includes another jack 90 which is similar in shape to jack 70 but will not accept connector 80. Another connector 81 is received within jack 90 and may have a cable 83 attached thereto for supplying power to the master unit 16. Master unit 16 may further contain another jack 92 for the input of alternative sound sources such as paging and/or music which are ultimately supplied to voice coils 30 and 68 in master unit 14 and slave unit 16 respectively.

In both the master unit 14 and slave unit 16 speakers 26 and 62 respectively are facing upwards when the units are installed as shown in FIG. 5.

With the use of easily disconnectable cable units 18 and self-contained units 14 and 16, it can be readily seen that the present invention provides a sound masking system which is capable of being easily moved from its present location to another location within the space to adapt to changing conditions therein.

OPERATION OF THE INVENTION

Figure 3:
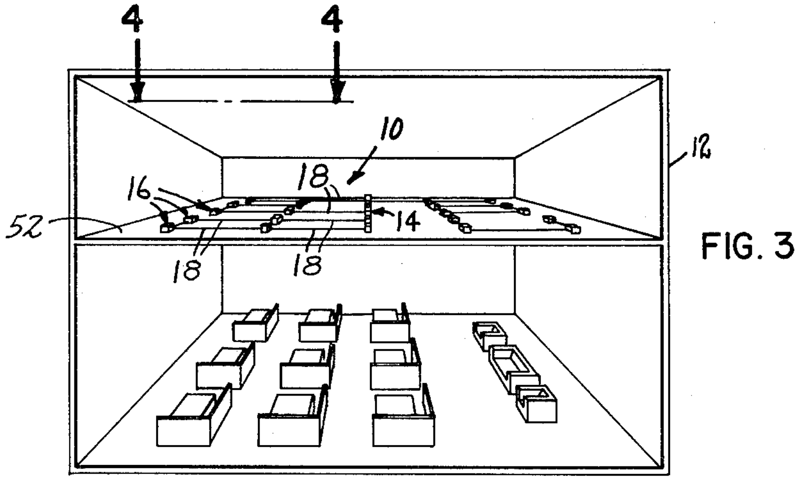
FIG. 3 is an elevated perspective of the interior of a building in section.

In order to obtain optimum results with the apparatus described herein, installation should be performed according to the method specified herein. When a large interior space is to be conditioned with masking sound, it is most desirable to use the master unit 14 in combination with a number of slave units 16 arranged into separate zones such as shown in FIGS. 3 and 4. A number of methods are available for determining the proper division of the interior space into zones.

Since only the master units 14 are capable of frequency control and since only one master is used per zone, the zones are defined by areas of equal or nearly equal ambient noise characteristics. FIG. 4 illustrates an arrangement of 3 distinct zones each having a master unit 14 and slave units (unnumbered) designated by black dots.

In order to determine zones of equal ambient noise characteristics, ambient noise can be monitored throughout the interior space. This can be accomplished by the use of commercially available spectrum analyzers which provide a graphic analysis of amplitudes within various frequency ranges of the audible spectrum. The results of the spectrum analysis can be plotted on blueprints of the space in order to analyze the space and divide it into zones of essentially similar ambient noise characteristics in much the same way as isothermal weather charts are made. The zones are then determined to be areas of relatively equal noise characteristics which are contiguous. The size of each zone is ultimately limited by the physical power output capability of the master, because one master is only capable of powering a finite number of slave units.

Once the zones have been defined as above, the master and slave units may be mounted within the ceiling plenum as shown in FIG. 5. A unique feature of the present invention is that the entire system of apparatus can be quickly installed and just as easily moved to meet changing situations within the interior environment. This is important because one of the primary advantages of open office planning is that it is exceedingly flexible. The ease of moving the apparatus of the present invention to meet the changes within the interior space is well suited to open space planning.

Within each zone, one master unit 14 must be located. Often it is centrally located, i.e., surrounded by slave units. The slave units 16 are located throughout the zone, usually 2 to 3 meters apart in order to provide relatively even coverage throughout the zone. The zone may be arranged as shown in FIG. 4 as a grid.

Once the slave and master units are located installation is accomplished by merely drilling holes in ceiling tile 52 to permit potentiometer shafts 42–48 of the master unit and 76–78 of the slave unit to extend through the tile for ease of adjustability. It is preferable to locate the units at the edges of tile 52 where the tile is better able to support the weight of the units. The master unit is then connected to a source of power at jack 90. An audio input may also be connected at jack 92. The source of power is generally a line voltage AC input and is transformed to a lower voltage. A cable 18 is connected at jack 70 of the master unit and run to one of the slave units 16, and is connected at jack 71 of the slave unit. FIG. 4 illustrates a grid layout having three zones determined by the above analysis to have similar ambient noise characteristics, indicated by the area encompassed by the three separate chains of sound masking units. Each chain contains a master unit 14 and a plurality of slave units 16 (shown as single black dots). As mentioned above, master unit 14 contains two jacks 70 which permit two strings of slave units to be attached at the master. This is the preferable connection in order to reduce line losses. Each slave unit 16 has a jack 71 and jack 70 (not shown). One of the jacks 71 in each slave 16 carries the signals from the master 14 to respective voice coil 62 and the jack 70 in the slave passes the signal on further slaves 16 via cable 18. Cable 18 carries a masking sound output signal from the master where it is generated. Also carried within cable 18 may be the alternative sound signals which are input to the master at jack 92. These audio signals may include paging, background music or other alternative audio signals.

The master unit 14 must then be adjusted by means of the 10 octave equalizer potentiometers 40 to produce proper masking. One recommended masking curve hereinafter referred to as a voice frequency shaped masking spectrum is shown on page 593 of *Noise Vibration Control* by L. Beranek, copyright 1971 McGraw Hill, New York, which is hereby incorporated by reference, and is reproduced herein as FIG. 8. This graph, which plots sound pressure levels in dB (10 dB/increment) versus frequency (1 octave/increment), illustrates a shaded range 94 in which optimum masking occurs. That is to say, a frequency spectrum measurement at a fixed height off the floor should fall within this shaded region 94 throughout the zone for optimum masking. In order to produce a spectrum within region 94, a masking signal must be added to the ambient noise existing in the space to produce a composite spectrum which falls within region 94 at any point throughout the zone measured at a fixed height off the floor. This fixed height is preferably the average height of a seated person or about 107 cm off the floor. This height is chosen since most users of the space will be seated and thus they will perceive this composite spectrum. At other heights, the spectrum perceived will not necessarily be the desired composite. This height can be varied depending upon the expected height at which users will be hearing the masking sound.

To produce this result the first master unit 14 is adjusted via potentiometers 40 to produce the above spectrum as measured by a spectrum analysis at this fixed height measured at points around or under the master unit 14.

As measurements are taken further away from the master 14, the output level of the slaves 16 will increasingly affect the composite spectrum because they will become the most dominant masking sound transmitter at that point in the zone. Due to the absorptive and reflective effects of furniture, wall dividers, ceiling tile, carpets, etc., within the zone, some areas of the zone will require greater or lesser amounts of masking sound to produce the desired composite spectrum. Potentiometers 44 on master 14 and 76 of slaves 16 control the sound masking output level of the respective units and must be adjusted so that the composite spectrum is attained relatively evenly throughout the zone. Spectrum measurements are made at the desired fixed height at numerous points in the zone. At each measurement point the amplitude of masking units in the vicinity is adjusted as necessary to produce the desired result. This will produce a generally uniform masking spectrum throughout the zone which falls within shaded region 94.

Figure 8:
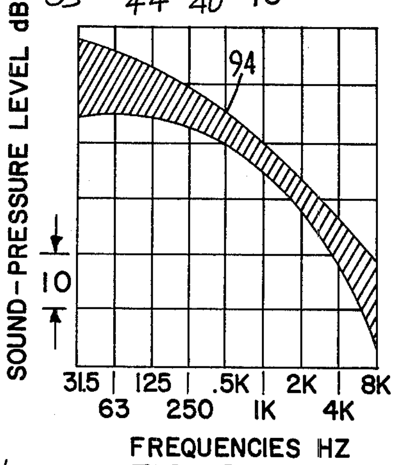
FIG. 8 is a voice frequency sound masking spectrum graph.

It should be noted that although the voice frequency shaped masking spectrum of FIG. 8 is utilized here, alternative spectra may be employed, though the method of adjustment described herein remains unchanged.

With the ambient noise sufficiently masked, it may be desirable to "re-tune" the system to provide masking suited to the individual users in the space. This is desirable since the masking system is now only tuned to mask average voices (ambient noise plus an "average" voice having an amplitude of 60 dB at 1 meter as measured at 3.7–4.9 meters in the specific environment contemplated) but may not effectively mask particularly loud or otherwise unusual voice spectra.

To make voices less distracting and to provide privacy for the person speaking, it is desirable to produce masking which makes speech relatively unintelligible at a given distance from the speaker. This distance is typically 3.7–4.9 meters (12–16 feet). Where users require a very high degree of privacy, the intelligibility index at this distance should be between 0.1–0.2, or in other words, at 3.7–4.9 meters only 10 to 20% of what the speaker says should be intelligible. A lesser degree of privacy, such as "low-distraction," should be masked to produce an index of 0.2–0.5. Between 0.5 and 1.0 masking is considered far less effective.

To achieve the desired index at a particular point within the zone, the system can be adjusted in one of two ways. First a spectrum measurement of the speaker's voice can be made at this fixed distance. Where the voice has peaks which extend above the desired composite spectrum, the amplitude of frequencies at these peaks can be raised to mask them. This is done by adjusting the appropriate potentiometer 40 on master 14. This will of course change the composite curve throughout the zone, since frequency adjustments at the master are carried to the slaves. These voice peaks can be covered by increased amplitude in the peak's frequency range up to about 6 dB over the original composite curve. Any further increase in amplitude becomes itself distracting and other masking techniques must supplement the system.

An alternative adjustment may be employed to mask these peaks. Recognizing that the range of frequencies which bears most heavily on intelligibility occurs in the range of 1–2 khz, by increasing the masking output in this range, beyond shaded region 94, will reduce the intelligibility of these troublesome voice peaks even though the frequencies of the voice peaks may not occur at 1–2 khz. Again, this adjustment is made at the master 14 via the appropriate potentiometers 40.

With the master and slave units installed and connected alternative audio input levels may also be adjusted to suit individual needs. The dual voice coil speakers 26 and 62 found in the master and slave units respectively, provide the possibility of adding a paging or music signal to the output to the units which is independent of the masking sound output. Adjustment of potentiometers 42 and 78 in the master and slave units respectively allows this alternative sound signal to be adjusted as desired. The use of a dual voice coil speaker is advantageous in that it results in less interference between the masking signal and any alternative sound signal.

The occupants within the space covered by the zone will be able to, by adjusting potentiometer 42 and/or 78, reduce or eliminate background music or paging signals without turning down the masking sound. This is a substantial improvement over prior systems in that occupants have frequently turned off the sound masking system in an attempt to eliminate background music which may be simultaneously added to the speaker output without the possibility of individual control or have had no control of audio signals at all.

Finally, when the occupants within the interior space and/or the furniture layout thereof is changed, the masking system may be easily readjusted to suit the changed environment or moved entirely if such changes require redefining of zones.

Numerous characteristics and advantages of the invention have been set forth in the foregoing description, together with details of structure and function of the invention, and the novel features thereof are pointed out in the appended claims. The disclosure, however, is illustrative only, and changes may be made in detail, especially in matters of shape, size, and arrangement of parts, within the principle of the invention, to the full extent of the broad general meaning of the terms in which the appended claims are expressed.

I claim:

1. A method for masking sound in particular zones of an interior space comprising the steps of:
(a) monitoring the ambient noise of said space;
(b) measuring the characteristic frequencies and amplitudes of said noise;
(c) establishing zones defined by areas contiguous of similar ambient noise characteristics;
(d) mounting a first device for producing a sound masking output centrally within each of said zones;
(e) mounting second devices for producing a sound masking output which is driven by the first device adjacent each of said first devices; and
(f) adjusting the output frequency and amplitude characteristics of each of said first and second devices to produce a composite masking signal which results in a voice frequency shaped masking spectrum at a fixed height from the ground throughout the zone.

2. A method according to claim 1 wherein step (b) includes the step of measuring said noise at a plurality of locations within the space and plotting the measurements on a map of the interior space.

3. A method according to claim 1 further including the step of establishing zones limited in size by the overall power limitations of the first device.

4. A method according to claim 1 wherein step (f) includes measuring the frequency and amplitude of said noise at said fixed height at a plurality of points within the zone and adjusting said first and second devices while making said measurements so that said composite signal is achieved uniformly through the zone.

5. A method for masking sound in particular zones of an interior space comprising the steps of:
(a) monitoring the ambient noise of said space;
(b) measuring the characteristic frequencies and amplitudes of said noise;
(c) establishing zones defined by areas contiguous of similar ambient noise characteristics;
(d) mapping zones defined by contiguous areas of similar frequency and amplitude spectra;
(e) locating a first device for producing a sound masking output within each of the zones;
(f) locating second devices for producing a sound masking output which is derived from the first device, throughout the zone adjacent the first device;
(g) adjusting the frequency and amplitude spectrum of the first device to achieve a composite of ambient noise and sound masking output which falls within a voice frequency shaped masking spectrum measured at a fixed height from the ground adjacent said first device; and (h) adjusting the amplitude of each of the second devices to produce said composite spectrum as measured in a plane located a fixed height from the floor of the interior space.

6. A method according to claim 1 or 5 wherein said fixed height is the average seated height of persons occupying the space defined by the zone.

7. A method according to claim 5 further including the steps of:

(a) measuring the spectrum of the voice of a user occupying the space defined by the zone at a distance of 3.7–4.9 meters from the user at the fixed height off the ground; and (b) adjusting the output frequency spectrum of the first device to increase the sound masking output above the user's voice spectrum.

8. A method according to claim 5 further including the steps of:

(a) increasing the output level of the first device within the one to two kilohertz range to reduce intelligibility of users speaking within the zone.

* * * * *